United States Patent
Yamamoto et al.

(10) Patent No.: US 6,424,201 B2
(45) Date of Patent: Jul. 23, 2002

(54) DIODE ELEMENT CIRCUIT AND SWITCH CIRCUIT USING THE SAME

(75) Inventors: Keiichi Yamamoto; Akio Oosaki, both of Kanagawa; Yoshihiko Hayashi, Tokyo, all of (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/865,593

(22) Filed: May 29, 2001

(30) Foreign Application Priority Data

May 31, 2000 (JP) ........................................ 2000-163071

(51) Int. Cl.$^7$ ............................................. H03K 17/74
(52) U.S. Cl. ........................................ 327/502; 327/423
(58) Field of Search ................................. 327/169, 189, 327/194–196, 302, 310, 314, 320, 325, 326, 382, 420–423, 494, 499–504, 570, 571, 580, 584, 585–588

(56) References Cited

U.S. PATENT DOCUMENTS

| | | | |
|---|---|---|---|
| 4,035,670 A | * | 7/1977 | Roman .................... 257/539 |
| 4,070,654 A | * | 1/1978 | Tachi .................. 148/DIG. 55 |
| 4,829,204 A | * | 5/1989 | Harris et al. ................. 327/113 |
| 5,349,230 A | * | 9/1994 | Shigekane ................... 257/471 |
| 5,903,028 A | * | 5/1999 | Quoirin et al. ............. 257/328 |
| 6,078,204 A | * | 6/2000 | Cooper et al. .............. 327/309 |

FOREIGN PATENT DOCUMENTS

| | | |
|---|---|---|
| JP | 7-66433 | 3/1995 |
| JP | 9-199733 | 7/1997 |

\* cited by examiner

*Primary Examiner*—My-Trang Nu Ton
(74) *Attorney, Agent, or Firm*—Mattingly, Stanger & Malur, P.C.

(57) ABSTRACT

A diode element circuit uses a junction between the base and collector of a vertical type PNP transistor as a diode, and is further designed that a reverse bias voltage is applied between base and emitter of a parasitic PNP transistor in the vertical type PNP transistor, thereby, a diode having a small leakage current and a high break down voltage is realized without necessitating an additional manufacturing process.

11 Claims, 4 Drawing Sheets

DIODE ELEMENT CIRCUIT AND SWITCH CIRCUIT USING THE SAME

BACKGROUND OF THE INVENTION

1. Field of the Invention

The present invention relates to a diode element circuit and a switch circuit using the same and, more specifically, relates a diode element circuit formed in an IC form having a high break down voltage and a small leakage current which is suitably used for the switch circuit in an IC tester.

2. Background Art

As typical conventional diodes which are formed in a monolithic IC circuit and perform rectification, a schottky barrier diode which utilizes a schottky junction between a metal and a semiconductor and a PN junction diode which utilizes a PN junction between a P type semiconductor and an N type semiconductor are enumerated. Among those, the schottky barrier diode has an advantage of a high break down voltage and a disadvantage of a large leakage current in a reverse direction.

The PN junction diodes include one using a PN junction between base and emitter of a transistor and one using a PN junction between base and collector of a transistor. A PN junction diode using a PN junction between base and emitter of a transistor which is generally used has an advantage of a small leakage current, but has a disadvantage of a low break down voltage. On the other hand, a PN junction diode using a PN junction between base and collector of a transistor shows a high break down voltage, but has a disadvantage of causing a leakage current to a substrate during being used in forward direction operation because of an influence of parasitic transistors around the junction.

Accordingly, in order to achieve at the same time both a small leakage current and a high break down voltage, a variety of measures have been proposed which devise material and structure of the diodes. As examples thereof, with regard to the schottky barrier diodes, JP-A-9-199733 (1997) is enumerated and with regard to the PN junction diodes JP-A-7-66433 (1995) is enumerated.

However, these measures bring about problems of requiring a special additional manufacturing process and difficulty of using a conventional manufacturing method and manufacturing device as they are. Further, since these measures complicate the manufacturing process, which causes problems of reducing the yield and increasing the manufacturing cost.

SUMMARY OF THE INVENTION

An object of the present invention is to resolve the above conventional problems and to provide a diode element circuit which requires no additional manufacturing process and realizes a small leakage current and a high break down voltage.

Another object of the present invention is to provide a switch circuit which achieves at the same time both a small leakage current and a high break down voltage and is, in particular, suitable for use in an IC tester.

A diode element circuit and a switch circuit using the same according to the present invention which achieve the above objects are characterized, in that in a diode element circuit formed in an IC which includes an anode electrode and a cathode electrode and uses a diode of a PN junction between base and collector of a PNP transistor, the PNP transistor is a vertical type transistor formed in a well region, and a voltage drop element which is connected between the collector of the transistor and the anode electrode is included, wherein the base of the transistor is connected to the cathode electrode and the well region is connected to the anode electrode.

As indicated in the above structure, the PN junction between base and collector of the PNP transistor which shows a small leakage current in the reverse direction is used, and in order to reduce a leakage current to a substrate due to parasitic transistors in the PNP transistor the voltage drop element is inserted between the anode electrode and the collector thereof as a bias circuit. Thereby, the collector side is placed in a lower potential than the well region to induce a potential difference therebetween. With this measure, the emitter potential of a PNP parasitic transistor is reduced which is constituted by the collector region of the PNP transistors serving as an emitter and the well region thereof serving as a base.

As a result, since a reverse bias is applied between the base and emitter of the parasitic transistor, when a forward current is flown and even when a current between the base and collector of the PNP transistor increases and a voltage drop is generated in the well region, a current value where the parasitic transistor is turned ON can be increased. Accordingly, if the diode is operated under a condition below such large current value, the leakage current from the collector region to the substrate is reduced to substantially zero.

As a result, the diode element circuit according to the present invention can realize a diode having a small leakage current and a high break down voltage in a monolithic IC circuit without adding a manufacturing process. Thereby, the switch circuit constituted by the diode element circuit likely enjoys the above advantages.

DETAILED DESCRIPTION OF THE PREFERRED EMBODIMENTS

Hereinbelow, an embodiment according to the present invention will be explained with reference to FIGS. 1 and 2.

Figure 1:
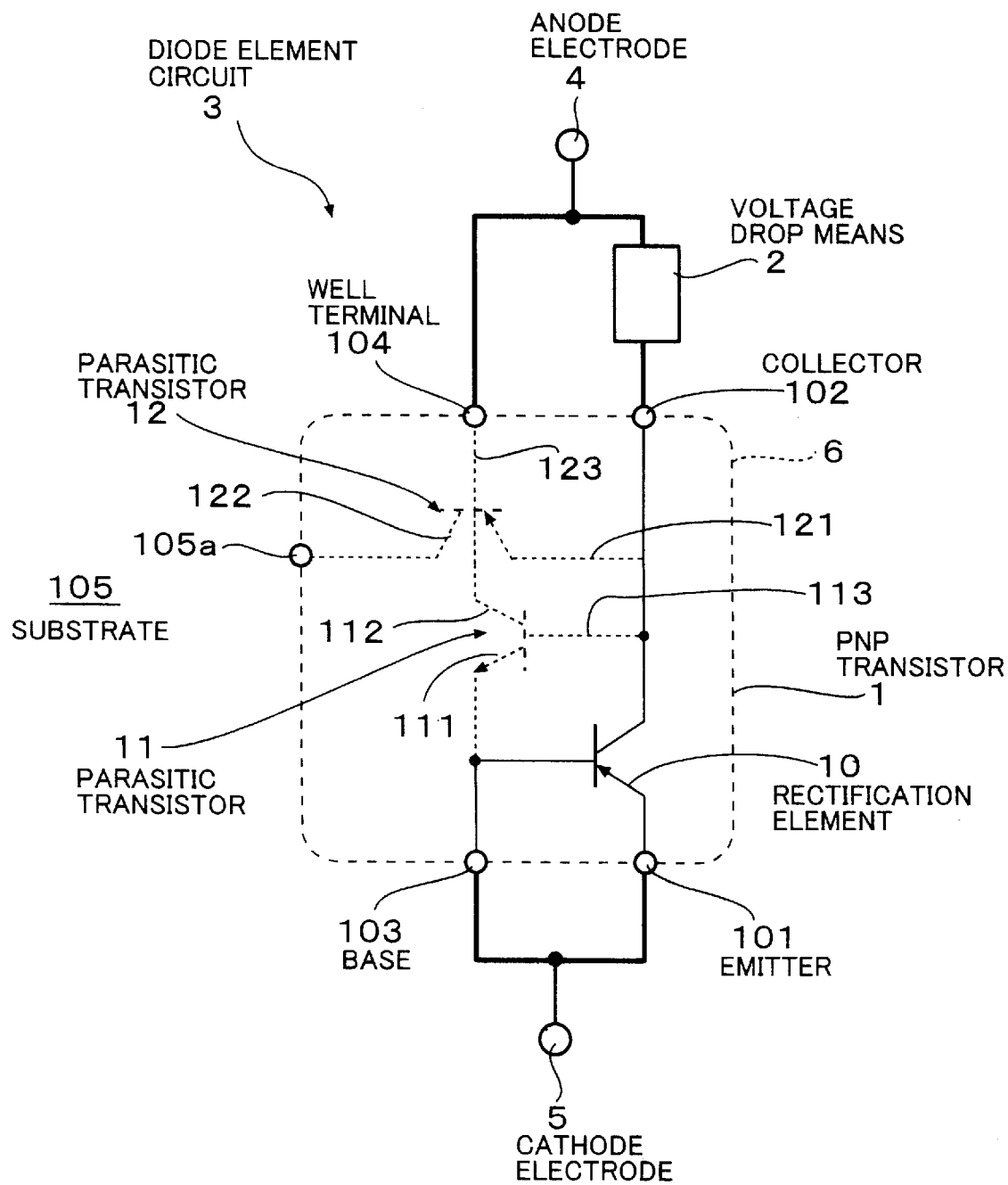
FIG. 1 is a circuit diagram showing one embodiment of a diode element circuit with a voltage drop means and a PNP transistor according to the present invention.
Figure 2:
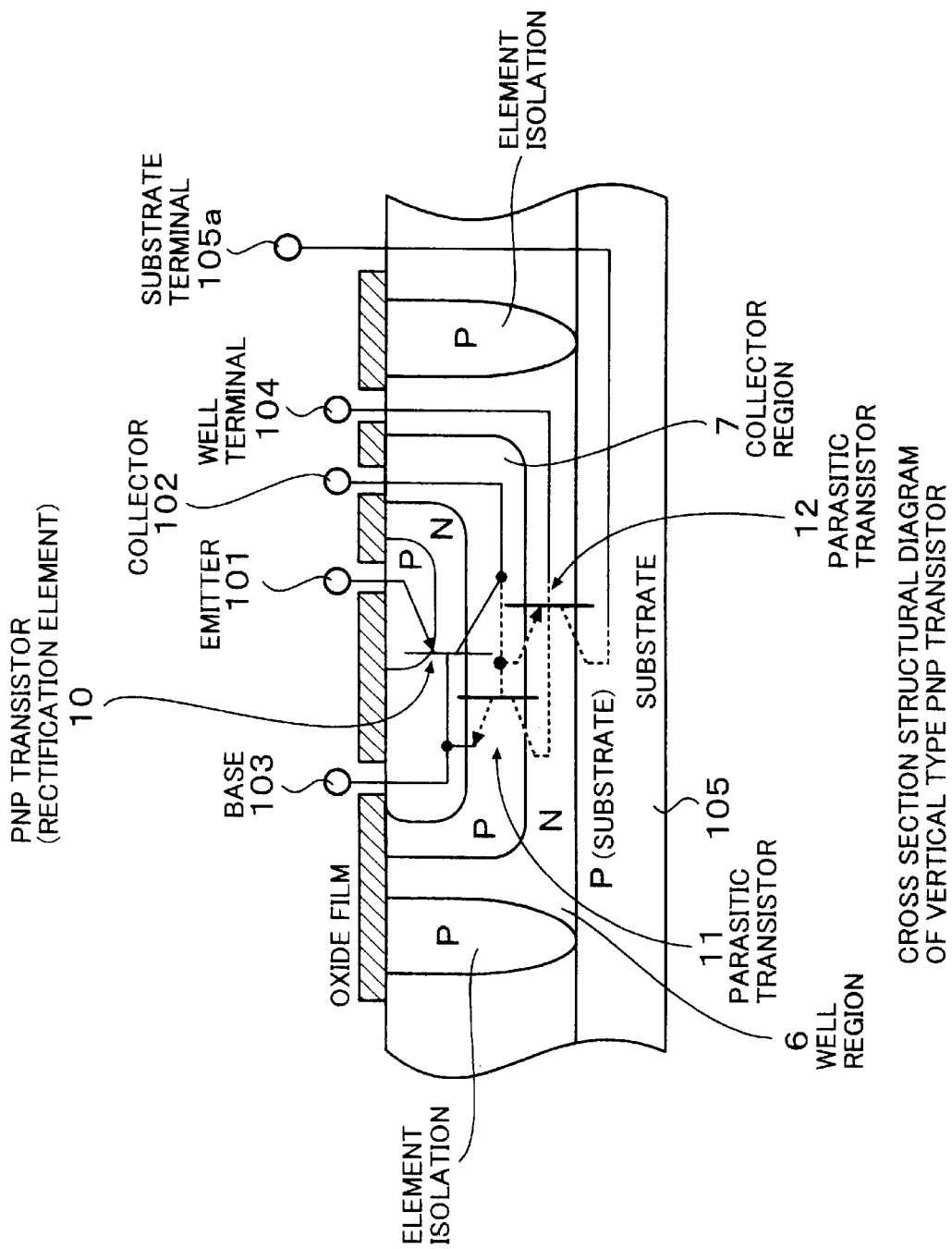
FIG. 2 is an explanatory view of a cross sectional structure of a vertical type PNP transistor used in a general monolithic IC circuit.

FIG. 1 is a circuit diagram showing one embodiment of a diode element circuit with a voltage drop means and a PNP transistor according to the present invention; and FIG. 2 is a cross sectional structural view of a vertical type PNP transistor used in a general monolithic IC circuit.

As shown in FIG. 1, a diode element circuit 3 is constituted by a PNP transistor 1 serving as a rectification element and a voltage drop means 2. An emitter terminal 101 and a cathode terminal 103 of the PNP transistor 1 are connected each other and are used as a cathode electrode 5 for the diode element circuit 3. Further, a collector terminal 102 of the PNP transistor 1 is connected to one terminal of the voltage drop means 2 and a well terminal 104 of the PNP transistor 1 is connected to the other terminal of the voltage drop means 2, and further, the well terminal 104 serves as an anode electrode 4 for the diode element circuit 3.

With this structure, a well region 6 which is connected to the well terminal 104 and is shown by a dotted line frame is set at a higher potential than a collector region (see FIG. 2) under a forward bias condition.

As illustrated in FIG. 2, the vertical type PNP transistor 1 as used in a general monolithic IC circuit is structured by alternatively sandwiching a P type semiconductor and an N type semiconductor, there exist parasitic transistor (NPN transistor) 11 and another parasitic transistor (PNP transistor) 12 other than the main body of the PNP transistor 10.

Among these parasitic transistors, when the parasitic transistor 11 is rendered conductive, a current flows from the well terminal 104 to the base terminal 103. As a result, when constituting a diode by making use of the junction between the base and collector of the PNP transistor 1, a current from the well terminal 104 is added to a current from the collector terminal 102 serving as the anode side for the current flowing into the base terminal serving as the cathode terminal. For this reason, when constituting a diode by making use of the junction between the base and collector of the PNP transistor 1, a positive electrode (anode terminal) is constituted by connecting the well terminal 104 and the collector terminal 102.

Further, when the resistance of the well is large, a voltage drop is caused inside the well due to the current flowing through the well, therefore, if the well terminal 104 and the collector terminal 102 are simply connected as explained above, the well potential lowers below the collector potential near the parasitic transistor 12 to render the parasitic transistor 12 conductive.

As a result, a current flows from the base terminal 103 serving as the cathode side to a substrate 105 to reduce the forward direction current and further, because of substrate potential rise an erroneous operation is caused in the surrounding circuits. Therefore, practically such circuit can not be used. For this reason, the potential of an emitter 121 (which corresponds to the collector region 7 of the PNP transistor main body 10) of the parasitic transistor 12 in the PNP transistor 1 is lowered by the voltage drop means 2 below that of the base 123 of the parasitic transistor 12, thereby, an application of a forward bias voltage (usually more than 0.7V) between the base and emitter of the parasitic transistor 12 is prevented, which will be explained later in detail. Because the conduction of the parasitic transistor 12 is prevented in this way, the leakage current to the substrate which is caused during use of the diode in its forward direction can be reduced.

Now, an operation of the diode element circuit 3 will be explained with reference to FIGS. 1 and 2.

Since in a general PNP transistor, the collector resistance is high, the potential of the cathode electrode 5 is higher than that of the anode electrode 4 in the above structure and under a condition where a reverse direction voltage is applied, a substantial part of the applied voltage is applied to the junction between the base and collector of the PNP transistor 1. Accordingly, the characteristic of the diode element circuit 3 at the time when a reverse direction voltage is applied is determined by the characteristic of the junction between the base and collector thereof (terminals 103 and 102), in that shows a large reverse break down voltage as well as. a small leakage current in reverse direction.

On the other hand, under a condition where a forward direction voltage is applied in which the potential at the anode electrode 4 is higher than the potential at the cathode electrode 5, the potential at the collector terminal 102 of the PNP transistor 1 is lowered below the potential of the well terminal 104 through the voltage drop means 2 by the voltage drop therein, therefore, a reverse bias voltage is applied between the base and emitter (terminals 121 and 123) of the parasitic transistor 12. Thus, the conduction of the parasitic transistor 12 is prevented and the leakage current from the anode electrode 4 to the substrate 105 is reduced.

At this moment, a reverse bias voltage corresponding to the voltage drop in the voltage drop means 2 is applied between the well region 6 and the collector region 7.

Further, when a current is flown from the anode electrode 4 to the cathode electrode 5, in that a current is flown in forward direction, a voltage drop is caused by the well resistance in a passage from the well terminal 104 of the PNP transistor 1 to the base terminal 123 of the parasitic transistor 12. With the voltage caused the parasitic transistor 12 is usually rendered conductive to cause a leakage current to the substrate 105, however, because of the provision of the voltage drop means 2, the parasitic transistor 12 is reversely biased and the limit current where the parasitic transistor 12 is rendered conductive can be increased.

Further, as the voltage drop means 2 other than the resistor such as a schottky barrier diode and PN junction diode formed by the junction between the base and emitter of an NPN and PNP transistor can be used. Still further, a plurality of these elements can be used therefor while connecting in combination.

Figure 3:
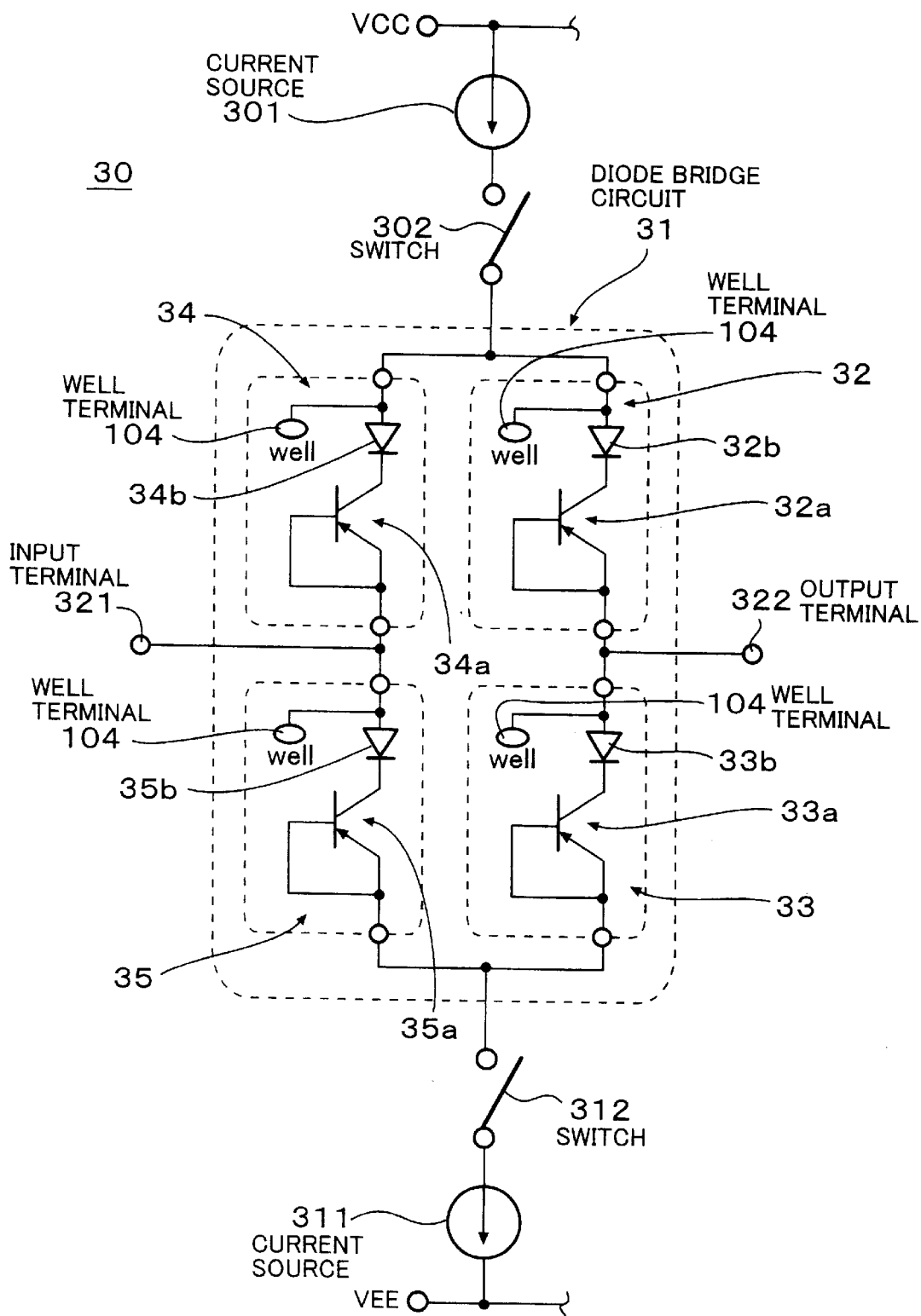
FIG. 3 is an explanatory view of an embodiment of a switch circuit according to the present invention.

FIG. 3 is a circuit diagram showing an embodiment of a switch circuit, in that an analogue switch for switching an input and output in an IC tester, in which the diode element circuit 3 according to the present invention is used. A switch circuit 30 for switching an input and output for an IC tester is constituted by four diode element circuits 32~35 each corresponding to the diode element circuit 3, current sources 301 and 311 and switches 302 and 312 as shown in FIG. 3.

The four diode element circuits 32~35 are respectively formed by a transistor 32*a* and a diode 32*b* serving as a voltage drop means, a transistor 33*a* and a diode 33*b* serving as a voltage drop means, a transistor 34*a* and a diode 34*b* serving as a voltage drop means and a transistor 35*a* and a diode 35*b* serving as a voltage drop means, and constitute a diode bridge circuit 31 as shown in FIG. 3. When the entirety of these constitutes an analogue switch, an input terminal 321 for the analogue switch is connected to the junction between the cathode electrode of the diode element circuit 34 and the anode electrode of the diode element circuit 35, and an output terminal 322 for the analogue switch is connected to the junction between the cathode electrode of the diode element circuit 32 and the anode electrode of the diode element circuit 33. As the remaining two terminals for the analogue switch into which a biasing current is flown, the junction between the anode electrode of the diode element circuit 32 and the anode electrode of the diode element circuit 34 constitutes an upstream side terminal, and the junction between the cathode electrode of the diode element circuit 33 and the cathode electrode of the diode element circuit 35 constitutes a downstream side terminal. The upstream side terminal is connected via the switch 302 to the current source 301 for current discharge, and the downstream side terminal is connected via the switch 312 to the current source 311 for current sink.

The current sources 301 and 311 are for flowing a bias current to the diode bridge circuit 31, and the current source 301 is connected to a power source line Vcc and causes to flow a current received from the line to the diode bridge circuit.

The current source 311 is connected to a power source line $V_{EE}$ at negative side and causes to sink the current flowing out from the diode bridge circuit 31 into the line.

Herein, the diodes 32*b*–35*b* are diodes which are formed at the same time in the same well region 6 and which can be formed as vertical type transistors as shown in FIG. 2, as other type transistors or as separate diodes formed separately in the well region 6. Now, an operation of the switch circuit 30 will be explained. Under a condition when the switches 302 and 312 are connected, by means of the upper current source 301 and the lower current source 311 a bias current is flown into the diode bridge circuit 31, therefore, the bridge circuit 31 is placed in an electrically balanced condition and the voltage at the input terminal 321 appears at the output terminal 322. Further, under a condition when the switches 302 and 312 are interrupted, since no bias current flows into the diode bridge circuit 31, the respective diodes are placed in an OFF condition, thus the output terminal 322 gives a high resistance. As will be seen from the above, the switch circuit 30 functions as an analogue switch which can perform switching of high/low impedance between the input terminal 321 and the output terminal 322 through connection/interruption of the switches 302 and 321.

Further, when the output terminal 322 is connected to an arbitrary device to be inspected (DUT), the switch circuit 30 can be utilized as a load current supply circuit (a current load circuit) for an IC tester.

More specifically, under an ON condition of the switches 302 and 321, when the voltage of the output terminal 322 connected to the output terminal of DUT, is lower than the voltage of the input terminal 321, a current flows out from the current source 301 to the output terminal of DUT, and further, when the voltage of the output terminal 322 is higher than the voltage of the input terminal 321, the current source 311 performs an operation of sinking a flow out current from the output terminal of DUT via the output terminal 322. Further, in this instance, the current sources 301 and 311 can be formed as a constant current source.

Herein, the respective diode element circuits 32~35 are constituted likely as the diode element circuit 3 and are provided with characteristics of high break down and a low leakage current. Therefore, a high voltage can be applied between the input and output terminals of the switch circuit 30, the switch circuit is suitable for a switch circuit for an IC tester and further, the switch circuit shows a characteristic of a small leakage current at the time of switch interruption.

Figure 4:
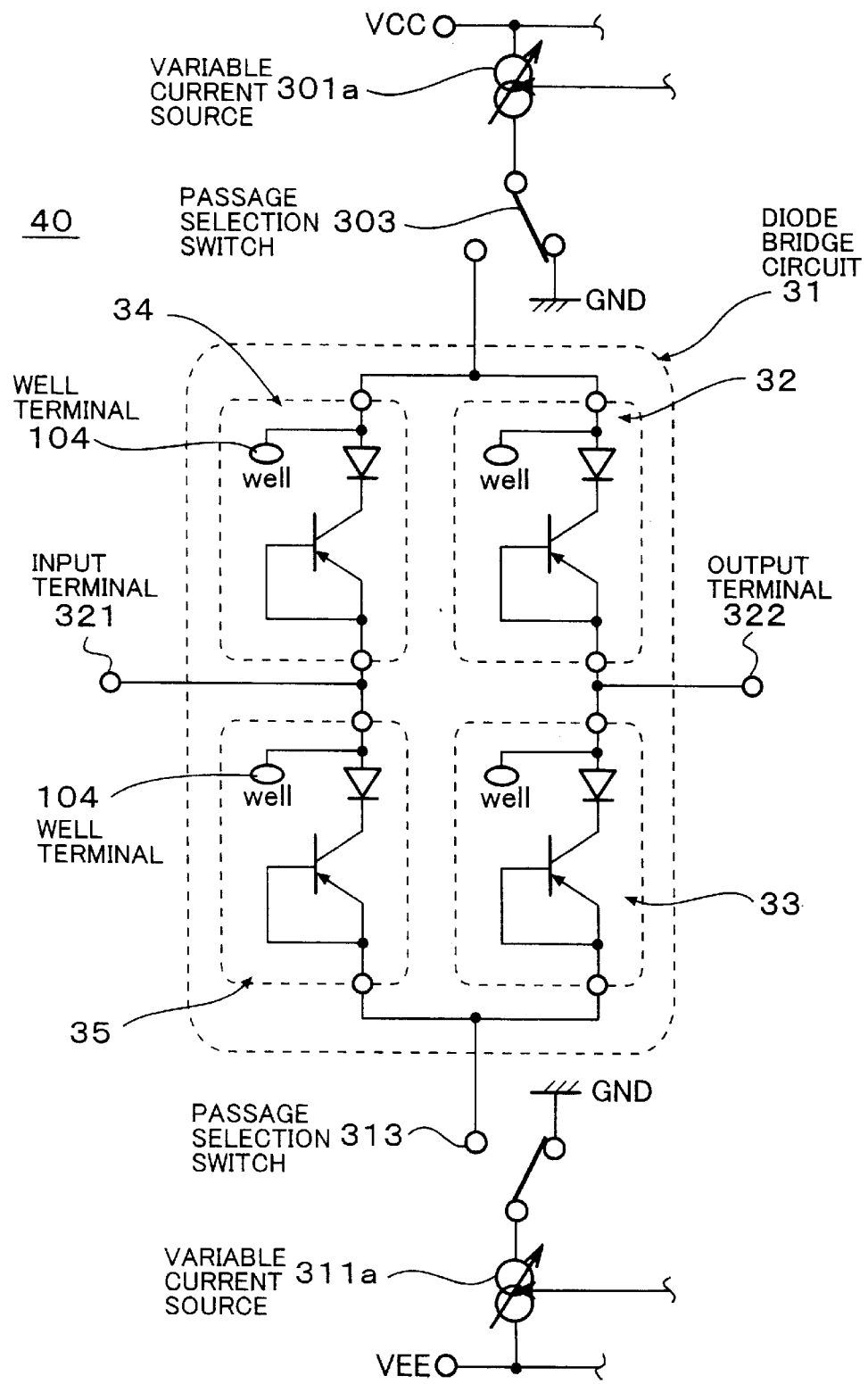
FIG. 4 is an explanatory view of another embodiment of a switch circuit according to the present invention.

FIG. 4 is a circuit diagram of another embodiment of a switch circuit for switching input and output in an IC tester in which a diode element circuit 3 according to the present invention is used.

A switch circuit 40 as shown in FIG. 4 is an example in which the switches 302 and 312 are respectively formed by change-over switches 303 and 313. Further, the current sources 301 and 311 are constituted by variable current sources 301a and 311a, so that the current values thereof can be set separately at predetermined constant current values through external control signal CONT, thereby, the current load condition to DUT can be varied. Other structure in FIG. 4 are the same as those in FIG. 3.

The change-over switches 303 and 313 are for changing over the current passages of the two variable current sources 301a and 311a between the side of the diode bridge 31 and the side of short circuiting (ground GN). The respective single pole sides in the respective single pole double throw type change-over switch are connected to the respective variable current sources 301a and 311a and each one of the double throws is connected to each one terminal of the diode bridge 31 and the other of the double throws are connected to the ground.

When both passages are changed over toward the diode bridge 31, like the switch circuit as shown in FIG. 3, a bias current is flown into the diode bridge by the upper and lower current sources and a voltage at the input terminal 321 appears at the output terminal 322. Further, when the both current passages are changed over toward the short circuiting sides, no bias current flows through the diode bridge, therefore, the respective diodes are rendered into OFF condition to give a high resistance at the output terminal 322. The other functions and advantages than the above in the switch circuit 40 are the same as those in the switch circuit 30.

What is claimed is:

1. A diode element circuit formed in an IC which includes an anode electrode and a cathode electrode and uses a diode of a PN junction between base and collector of a PNP transistor, the PNP transistor is a vertical type transistor formed in a well region, and a voltage drop element which is connected between the collector of the transistor and the anode electrode is included, wherein the base of the transistor is connected to the cathode electrode and the well region is connected to the anode electrode.

2. A diode element circuit according to claim 1, wherein said voltage drop element is a diode element.

3. A diode element circuit according to claim 1, wherein said voltage drop element is a diode element formed in the well region.

4. A switch circuit comprises a bridge circuit formed by bridge-connecting a plurality of the diode element circuits, each of the diode element circuits is formed in an IC and includes an anode electrode and a cathode electrode and uses a diode of a PN junction between base and collector of a PNP transistor, the PNP transistor is a vertical type transistor formed in a well region, and a voltage drop element which is connected between the collector of the transistor and the anode electrode is included, wherein the base of the transistor is connected to the cathode electrode and the well region is connected to the anode electrode.

5. A switch circuit according to claim 4, wherein said voltage drop element is a diode element.

6. A switch circuit according to claim 4, wherein said voltage drop element is a diode element formed in the well region.

7. A switch circuit according to claim 4, further comprising first and second current sources which provide a bias current to said bridge circuit; and switches which are disposed respectively between said first and second current sources and said bridge circuit.

8. A switch circuit according to claim 6, wherein said first and second current sources are respectively constant current sources, said first current source discharges the constant current into said bridge circuit, said second current source sinks the constant current from the bridge circuit, and said switches are respectively change-over switches which select a current flow passage from the constant current sources either to said bridge circuit or to a reference potential line.

9. A switch circuit according to claim 7, wherein current values of said respective constant current sources are set separately depending on a control signal.

10. A switch circuit according to claim 7, wherein said bridge circuit is a switch circuit for switching input and output of an IC tester.

11. A switch circuit according to claim 7, wherein said bridge circuit is a load current supply circuit of an IC tester.

* * * * *